MOUNTING OF ELECTRONIC COMPONENTS ON BASEBOARD OR PANEL

Filed Jan. 3, 1967 2 Sheets-Sheet 1

Oct. 28, 1969 R. G. KNOWLES 3,475,657

MOUNTING OF ELECTRONIC COMPONENTS ON BASEBOARD OR PANEL

Filed Jan. 3, 1967 2 Sheets-Sheet 2

United States Patent Office 3,475,657

Patented Oct. 28, 1969

3,475,657
MOUNTING OF ELECTRONIC COMPONENTS ON BASEBOARD OR PANEL

Robert G. Knowles, Litchfield, Conn., assignor to Litton System, Inc., Beverly Hills, Calif., a corporation of Maryland Filed Jan. 3, 1967, Ser. No. 606,862
Int. Cl. H02b *1/04, 1/00, 9/00*
U.S. Cl. 371—101 3 Claims

ABSTRACT OF THE DISCLOSURE

A plurality of modular units comprising twin connectors are releasably mounted on a motherboard by means of a securing device. The connectors detachably receive a pair of circuit boards and have detachable means to electrically connect the motherboard to the circuit boards. The location of the securing means reduces the required motherboard area.

This invention relates to the packaging and assembly of electronic components, and more particularly to means for supporting and interconnecting printed circuit boards, integrated circuit boards and the like, to form a composite structure, sometimes fererd to as modular construction.

It is an object of the invention to provide compact and reliable means for supporting and interconnecting modular electronic units, such as printed circuit boards, and for interconnecting circuit boards of various types with a baseboard or "motherboard" provided with interconnecting circuit elements, such as strips of conducting material on or embedded in the surface of the baseboard.

Another object of the invention is to provide packaging and interconnecting means for electrical assemblies which will facilitate the testing of the electrical components and the replacement of defective components or subassemblies.

Another object of the invention is to provide novel interconnecting means for component boards and a base panel or "motherboard," the compoment boards being removable from the base panel without unsoldering or severing the connections.

Another object of the invention is to provide mounting arrangements for printed circuit boards of the character described which do not interfere with the use of the full connector length for board edge terminals. Because of the trend to miniaturization of electric components, the functional size of the mounting board may be fixed or limited by the number of electrical terminals. It is, therefore, important to have the full board width available for electrical terminals rather than mounting screws as is usually done.

A further object of the invention is to improve modular construction of the character described by employing a novel printed circuit board connector, such as a twin connector, which allows one set of mounting hardware to secure both halves of the connector to the base panel. This conserves space and weight, while the central location of the fastening means and the increased size of the base enhances the stability of the connector and reduces the tendency to bow or crack the base panel.

A still further object of the invention is to provide a compact circuit board packaging arrangement which includes a metallic heat sink for absorbing heat from the electronic components, the heat sink being arranged to reinforce and support the circuit boards to prevent damage from vibration or shock.

A feature of the invention relates to a clip for securing the printed circuit board in place after it has been plugged into the connector. The clip also provides a ground circuit to the ground plane of the base or "motherboard."

Another feature of the invention is the flexibility of the modular construction according to the invention which allows the packaging engineer to use either flat board packaging or module packaging with the same hardware and interconnecting devices.

Other features, objects and advantages of the invention will appear from the following description of typical embodiments thereof shown in the accompanying drawings, wherein.

Figures 1, 2, 3:
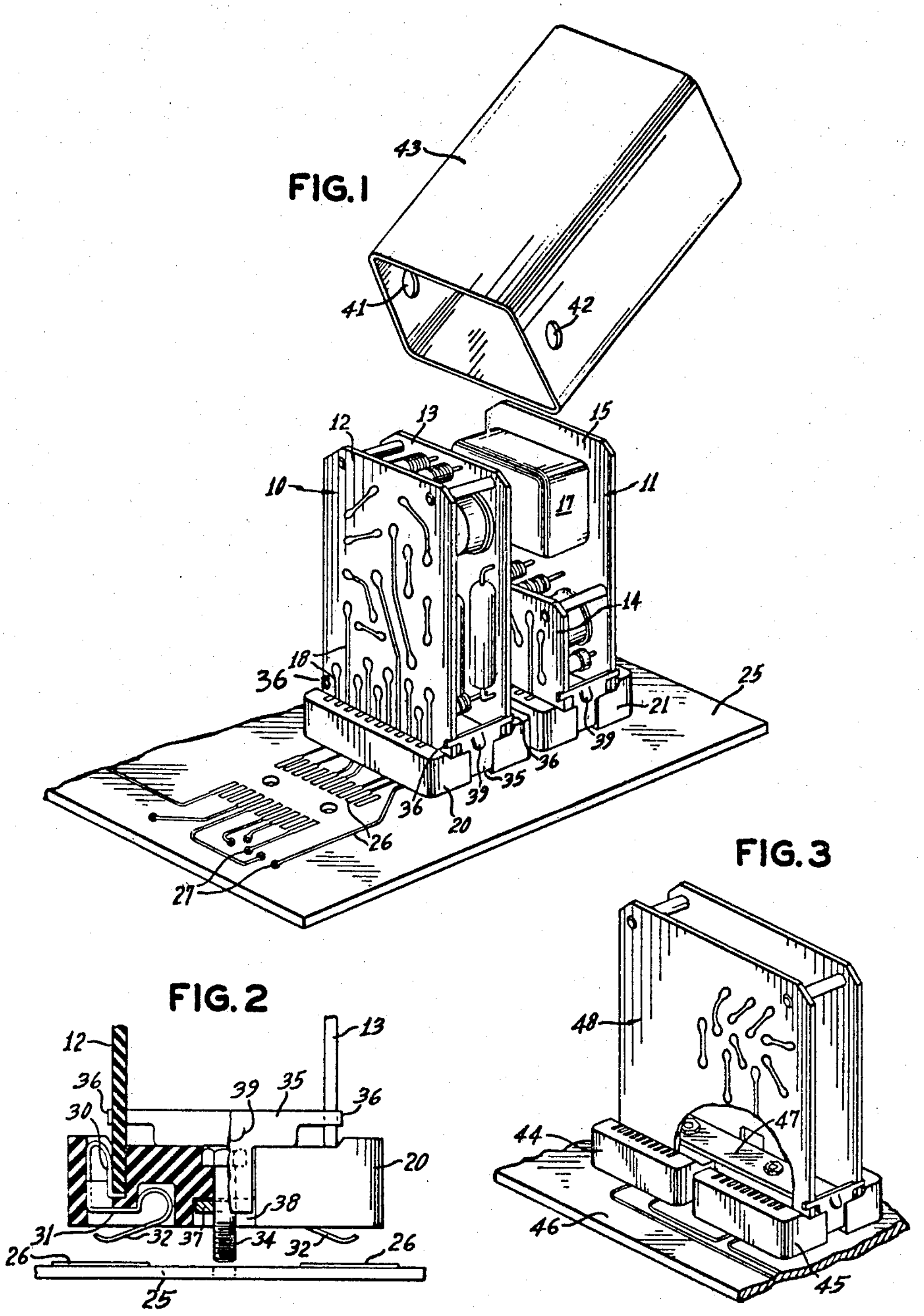
FIG. 1 is a perspective view to an enlarged scale of a portion of one type of modular package including printed circuit boards and a base or "motherboard" connected to the printed circuit boards.
FIG. 2 is a detail view to an enlarged scale and partly in cross-section of the connector, printed circuit boards and baseboard shown in FIG. 1.
FIG. 3 is a perspective view similar to FIG. 1 showing the use of a pack strap for attaching two or more connectors together to accommodate a double-width printed circuit board.

Referring to the drawings, the invention may be embodied in electronic assemblies of various kinds comprising printed circuit boards or equivalent elements, some of which are illustrated in the drawings. Thus a typical electronic circuit module 10, as shown in FIGS. 1 and 2 by way of example, comprises a pair of insulating panels or boards 12, 13 forming a pluggable unit to be plugged into a twin socket connector 20. A second component module 11 including the panels or circuit boards 14 and 15 is adapted to be plugged into a twin connector 21. On the insulating panels 12, 13, 14 and 15, respectively, are mounted conventional circuit components interconnected by the usual conducting elements, as shown. While the so-called "cordwood" construction is shown in the module 10, the circuit board assemblies obviously may be of different types including integrated circuit elements. The panel or circuit board 14 of FIG. 1 is shown as a short panel to leave sufficient room for mounting a transformer or relay unit 17 on the panel 15. It will be obvious that the invention is not limited to electronic modules of the shape or construction shown by way of example.

The conducting elements or strips 18 on the circuit board 12 engage the upper contact portions 30 of connector contacts 31 when the board is plugged into the connector 20. The boards 13, 14 and 15 cooperate with similar resilient contacts in the connectors 20 and 21, to establish electrical connections to the baseboard 25. Thus the component boards may be removed from the component header without unsoldering connections.

In accordance with a feature of the invention, the twin headers or connectors 20 and 21 are releasably mounted on a baseboard or "motherboard" 25 which, as shown by way of example, is of the type which includes conducting elements or strips 26 for interconnecting the various modules on the baseboard and also providing electrical connections to the usual baseboard terminal portions 27. An advantage of this construction is that the unit 10 or 11 may be removed from the baseboard and replaced as a unit without unsoldering any connections. As shown in FIG. 2, the respective connector contacts 31 are also provided with resilient contact portions 32 at the bottom face of the connector adapted to engage the contact elements 26 on the baseboard 25. The connectors 20, 21 are detachably mounted on the baseboard 25, as by means of a screw or bolt 34 or equivalent securing device. Where a bolt is used to attach the connector to the baseboard, a threaded nut (not shown) is threaded on the bolt 34. The location of the securing device 34 between the rows of connector and baseboard contacts reduces the required baseboard terminal area to a minimum and its central location reduces the tendency to bow or crack the baseboard.

In order to lock the circuit boards 12 and 13 in the connector 20, a spring retainer clip 35 is provided, said clip having lateral ears 36 engaging slots in the edges of the respective panels, as shown in FIGS. 1 and 2. Thus the circuit boards are secured in place when the module is subjected to vibration. An elongated central portion 37 of the clip extends underneath the edges of the recess 38 in the connector block to secure the retainer clip in place. The clip 35 is also provided at both ends with integral tabs 39 which engage the edges of holes 41 and 42 in the bottom of a shield or dust cover 43 enclosing the modules mounted on the baseboard. If desired, the cover or shield 43 may be grounded by grounding the retainer clip 35 through the bolt 34.

From the foregoing description, it will be appreciated that the invention relates to a compact assembly and mounting arrangement for printed circuit boards, and multi-laminate boards in general, providing reliable interconnections and flexibility in design, i.e., the possibility of using "cordwood" packaging and flat two-dimensional packaging on the same "motherboard" with the same header or connector. Furthermore the individual modules may be removed or replaced without unsoldering connections, and the assembly including the socket connector is detachable, thus reducing the chances of damaging the expensive "motherboard." The pressure-type cantilever contact spring 31 on the bottom of the header assembly provides a reliable connection to the contact pads or strips on the "motherboard." The location of the header securing device 34 conserves space and reduces the edge terminal area on the "motherboard" to a minimum. Circuit boards of different sizes may be mounted in standard socket connectors by simply attaching two or more connectors together.

Figure 4:
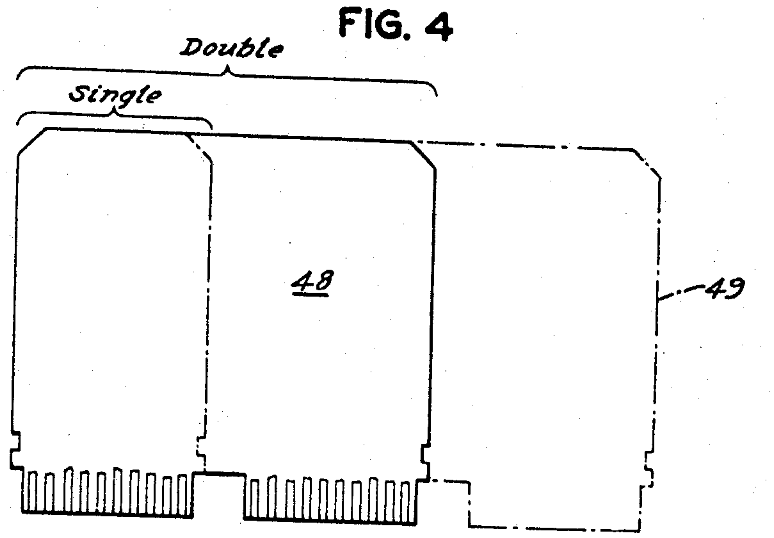
FIG. 4 is a plan view of the double printed circuit board of FIG. 3.

This modification is shown in FIG. 3, which illustrates the mounting of a pair of connectors 44 and 45 side by side on a baseboard or panel 46 corresponding to the board 25 of FIGS. 1 and 2. The connectors 44 and 45 are attached together by a central pack strap 47 to form a unitary socket assembly for receiving a circuit board module 48 of double width. Thus the mounting and assembly arrangement according to the invention may be readily adapted to mount and interconnect boards of various sizes, a triple-width board 49 being indicated in dotted lines in FIG. 4. In the case of a triple-width circuit board, three connectors are attached together, as by a strap similar to the strap 47.

Figures 5, 6:
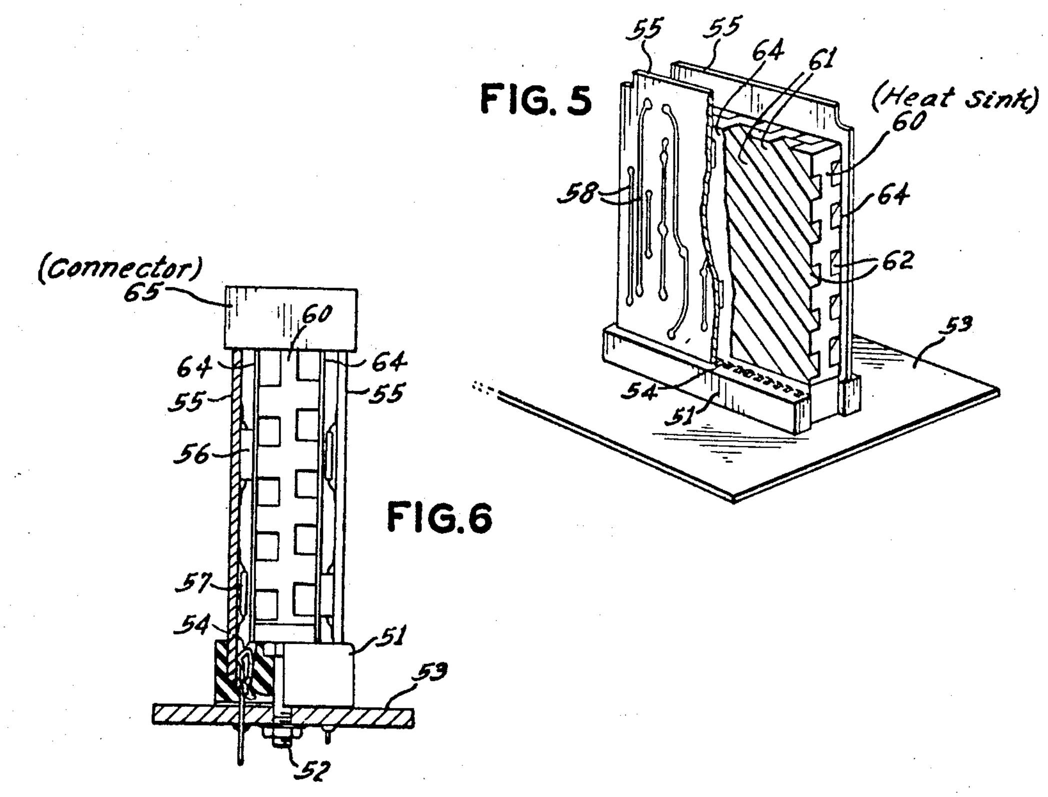
FIG. 5 is a prespective view of a modified circuit board assembly.
FIG. 6 is a side elevation view of the modular unit shown in FIG. 5.

FIGS. 5 and 6 illustrate another modification of an arrangement for packaging electronic components according to the invention. Referring to these figures, a twin connector 51 similar to the connector 20 is provided for the component or printed circuit boards. The connector 51 may be attached by suitable means, such as a bolt 52, to a base panel or "motherboard" 53, as in the modification of FIGS. 1 and 2. The central location of the mounting bolt 52 utilizes the waste space between the circuit boards. In this modification, the connector 51 is provided with spring contact members 54 disposed in vertical slots in the body of the connector and soldered to the conducting elements of the printed circuit board, as indicated. The printed circuit or component boards 55, as shown, embody the usual components 56, 57, such as capacitors, resistors, and the like. Other equivalent component boards may be mounted in a similar manner. In the case of a printed circuit board, the components 56, 57 are connected together by printed contact elements 58 or the equivalent.

In the construction shown, a grooved metallic plate 60 is interposed between the two printed circuit boards

55, the plate performing two important functions, i.e., dissipating heat from the assembly and bracing the boards 55 against movement or damage when the assembly is subjected to vibration. As shown, the heat sink formed by the plate 60 is provided with a series of inclined ribs 61 forming spaced grooves 62 on one or both sides of the plate to facilitate the flow of air through the heat sink. If desired, thin plates or sheets 64 of metal or another suitable material may be interposed between the heat sink and the components mounted on the boards 55. A connector 65 is also shown at the top of the printed circuit boards to interconnect the components mounted thereon.

It will be apparent that this construction possesses the advantages of that shown in FIGS. 1 and 2 and the additional advantages afforded by the use of the heat-dissipating members 60, which also supports the printed circuit boards. The arrangement is extremely flexible as it permits either cordwood or flat mounting of components. Interboard connectors 65 may be used to link component boards at the top without restricting the bottom terminal area. The use of a twin connector with centrally located mounting hardware utilizes the space between the individual printed circuit boards and conserves the baseboard area which is used for external terminals. Furthermore the increased size of the base of the twin connector reduces the likelihood of damaging the expensive baseboard when the electronic assembly is bolted thereto.

While the invention has been described with reference to specific embodiments for the purpose of explaining the underlying principles thereof, it will be obvious that various modifications and variations in the detailed construction shown may be made without departing from the scope of the invention. Thus, by way of example and not of limitation, it is apparent that the type of circuit board connector and the design of the contact members in the interconnecting devices may be different from that shown, while performing essentially the same functions. It is the intention, therefore, to be limited only as indicated by the scope of the appended claims.

What is claimed is:

1. An assembly and mounting arrangement for detachably connecting a plurality of planar circuit carrying boards in outstanding transverse relationship to a base panel comprising:

a base panel having a substantially planar surface supporting electrical conductors adapted for surface contact, a plurality of twin socket detachable connectors, each connector having a pair of spaced parallel arranged socket portions containing inner contacts and with each female socket portion detachably receiving and supporting in upright relationship the edge portion of a planar circuit board, the inner contacts in said socket portions making detachable electrical connection with electrical contacts proximate the edges of the circuit boards when the edge portions of the boards are inserted into the socket portions of the connectors, each said connector detachably retaining said pair of circuit boards in closely spaced upright parallel relationship, each said connector being provided with electrical conducting members interconnecting said inner contacts within the socket portions with external contacts on the socket, said external contacts providing means for detachably engaging the electrical conductors on the base panel, means for detachably securing each of said connectors to the panel board for structural interconnection and electrical inerconnection of the external contacts with the electrical conductors on the base panel, said detachable securing means including a mounting bolt passing through an opening in each connector disposed intermediate said pair of socket portions at a position inwardly from opposite ends of the connector, whereby said mounting bolt for each connector is positioned intermediate said pair of detachably supported planar circuit boards and substantially concealed thereby.

2. An assembly and mounting arrangement for electronic component boards comprising a base panel, surface contact members on said base panel, a plurality of modular edge board connectors, each engaging and supporting a pair of component boards, said connectors being provided with contact members for interconnecting the component boards with the contact members on said base panel, and means for detachably securing each of said modular edge board connectors to the base panel, said means including a mounting bolt located between the pair of component boards on the connector, each component board being locked to its connector by a spring retainer clip disposed between the pair of boards, said clip being secured to the connector and provided with projecting ears at each end engaging the respective component boards.

3. An assembly and mounting arrangement for electronic component boards according to claim 2, in which a hood or dust cover is provided for a pair of component boards mounted on said connector, said hood or cover being engaged by and secured in position by the spring retainer clip.

References Cited

UNITED STATES PATENTS

| | | | |
|---|---|---|---|
| 2,169,708 | 8/1939 | O'Callaghan. | |
| 2,885,603 | 5/1959 | Rose. | |
| 3,061,182 | 10/1962 | Corrado et al. | |
| 3,193,791 | 7/1965 | Bock et al. | |
| 3,215,968 | 11/1965 | Herrmann. | |
| 3,243,660 | 3/1966 | Yuska | 317—100 |
| 3,334,325 | 7/1967 | Conrad et al. | |

OTHER REFERENCES

Electronic Design, Apr. 27, 1964, p. 87 (339–17LM).

Boehm et al., "Bolted-Down Module Joins Subcircuits to Mother Boards," Electronic Design, Aug. 16, 1963, pp. 104, 106, 107 (339–17LM).

ROBERT S. MACON, Primary Examiner

D. SMITH, Jr., Assistant Examiner

U.S. Cl. X.R.

317—100; 339—17, 176